United States Patent
Wang

(10) Patent No.: US 9,620,659 B2
(45) Date of Patent: Apr. 11, 2017

(54) PREPARATION METHOD OF GLASS FILM, PHOTOELECTRIC DEVICE AND PACKAGING METHOD THEREOF, DISPLAY DEVICE

(71) Applicant: BOE Technology Group Co., Ltd., Beijing (CN)

(72) Inventor: Dan Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 22 days.

(21) Appl. No.: 14/564,878

(22) Filed: Dec. 9, 2014

(65) Prior Publication Data

US 2016/0118619 A1 Apr. 28, 2016

(30) Foreign Application Priority Data

Oct. 23, 2014 (CN) .......................... 2014 1 0574969

(51) Int. Cl.
*H01L 21/00* (2006.01)
*H01L 31/048* (2014.01)
*H01L 51/52* (2006.01)
*C03C 8/24* (2006.01)
(Continued)

(52) U.S. Cl.
CPC .............. *H01L 31/048* (2013.01); *C03C 8/24* (2013.01); *C03C 23/0025* (2013.01); *C03C 27/06* (2013.01); *H01L 51/5246* (2013.01)

(58) Field of Classification Search
CPC ... C03B 19/06; H01L 51/524; H01L 51/5246; H01L 51/56; H01L 2227/323; H01L 27/3276; H01L 51/0072; H01L 51/5056; H01L 27/3246; H01L 27/3248; H01L 27/3262; H01L 2251/301; H01L 51/0058;
(Continued)

(56) References Cited

U.S. PATENT DOCUMENTS 5,949,184 A * 9/1999 Ohoshi .................... G09G 3/22 313/485
7,214,429 B2 * 5/2007 Kato ......................... C03C 8/24 428/404

(Continued)

FOREIGN PATENT DOCUMENTS

CN 1513039 A 7/2004
CN 103346163 A 10/2013
(Continued)

OTHER PUBLICATIONS

Jun. 2, 2016—(CN) First Office Action (with English Translation)—App. No. 201410574969.X.
(Continued)

*Primary Examiner* — Robert Bachner
(74) *Attorney, Agent, or Firm* — Banner & Witcoff, Ltd.

(57) ABSTRACT

A preparation method of a glass film, a photoelectric device and a packaging method thereof, and a display device are provided, and the preparation method of a glass film includes: forming a sacrificial layer on a base substrate; forming a glass frit film on the sacrificial layer; solidifying the glass frit film; and removing the sacrificial layer, so as to obtain a glass film. The method can bring an individual glass film, which is helpful to a narrow-bezel design of a photoelectric device.

13 Claims, 3 Drawing Sheets

(51) Int. Cl.
*C03C 23/00* (2006.01)
*C03C 27/06* (2006.01)

(58) Field of Classification Search
CPC  H01L 51/006; H01L 51/0061; H01L 51/5072
See application file for complete search history.

(56) References Cited

U.S. PATENT DOCUMENTS

| | | | |
|---|---|---|---|
| 2003/0066311 A1* | 4/2003 | Li | C03C 27/06 65/43 |
| 2004/0207314 A1* | 10/2004 | Aitken | C03C 3/072 313/504 |
| 2008/0039312 A1* | 2/2008 | Natsuhara | C04B 35/581 501/153 |
| 2016/0149165 A1* | 5/2016 | Kim | H01L 51/5284 257/40 |

FOREIGN PATENT DOCUMENTS

| | | | |
|---|---|---|---|
| CN | 103681756 A | | 3/2014 |
| JP | 2001023771 A | | 1/2001 |
| JP | 2003115261 A | * | 4/2003 |
| JP | 200993089 A | | 4/2009 |
| WO | 2014007528 A1 | | 1/2014 |

OTHER PUBLICATIONS

Feb. 4, 2017—(CN) Second Office Action Appn 201410574969.X with English Tran.

* cited by examiner

PREPARATION METHOD OF GLASS FILM, PHOTOELECTRIC DEVICE AND PACKAGING METHOD THEREOF, DISPLAY DEVICE

This application claims priority to Chinese Patent Application No. 201410574969.X, filed on Oct. 23, 2014. The present application claims priority to and the benefit of the above-identified application and is incorporated herein in its entirety.

TECHNICAL FIELD

At least one embodiment of the disclosure relates to a preparation method of a glass film, a photoelectric device and a packaging method thereof, and a display device.

BACKGROUND

In recent years, organic light-emitting diode (OLED) devices are gradually getting attention as novel flat plate displays. Because of features such as active luminescence, high brightness, high resolution, wide viewing angle, fast response speed, low energy consumption, and capability of being flexible, OLED devices are likely to be developed into the next generation display technology to replace liquid crystal displays.

An OLED device generally includes two electrodes placed oppositely with an organic light-emitting element interposed therebetween, and the organic light-emitting element can give out light when an electric current passes through it. Because the material of the organic light-emitting element is very sensitive to moisture and oxygen, the OLED device needs to be packaged, so as to improve the service life thereof.

SUMMARY

At least one embodiment of the disclosure provides a packaging method of a photoelectric device, which includes: providing a glass film; placing a first substrate and a second substrate oppositely with a photoelectric element interposed therebetween; and making the glass film and a side surface of a lamination of the first substrate and the second substrate form a sealing structure, so that the photoelectric element is sealed between the first substrate and the second substrate.

At least one embodiment of the disclosure further provides a photoelectric device, which includes a first substrate and a second substrate that are placed oppositely, a photoelectric element interposed between the first substrate and the second substrate, and a glass film. The glass film is placed on a side surface of a lamination of the first substrate and the second substrate, and the glass film, the first substrate and the second substrate form a sealing structure.

At least one embodiment of the disclosure further provides a display device, which includes the above-mentioned photoelectric device.

At least one embodiment of the disclosure further provides a preparation method of a glass film, which includes: forming a sacrificial layer on a base substrate; forming a glass frit film on the sacrificial layer; solidifying the glass frit film; and removing the sacrificial layer, so as to obtain a glass film.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

REFERENCE SIGNS

Figure 1:
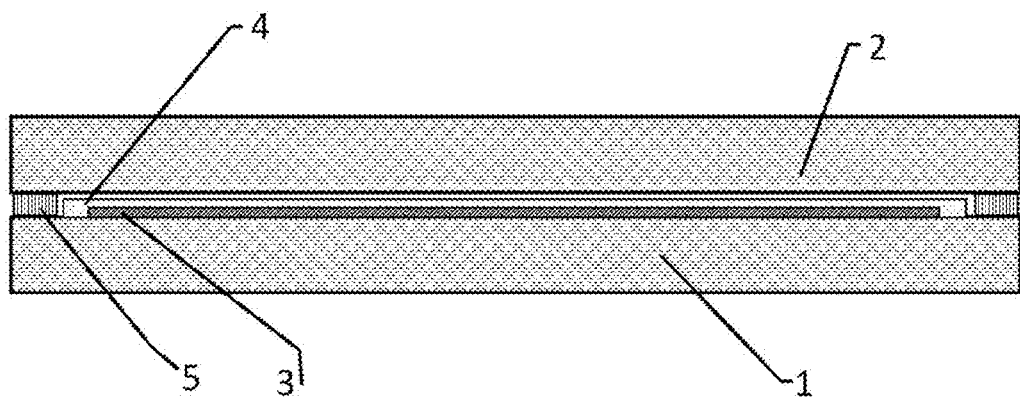
FIG. 1 is a schematic view illustrating a packaging structure of an OLED device.

1, 10—first substrate; 2, 20—second substrate; 3, 30—photoelectric element; 4, 40—passivation layer; 5, 50—glass film; 51—base substrate; 52—sacrificial layer; 53—glass frit film.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Glass-film packaging methods can be applied to but not limited to the packaging of small-sized or medium-sized OLED devices. But, a thin film with stable properties cannot be obtained from a glass material in powder form or in block shape, so a method for packaging an OLED device can be performed as follows. Firstly, a glass frit (glass powder) is dispersed in an adhesive to form a glass paste; then, the glass paste is applied on a surface of a substrate by a screen printing method or a coating method, for example, to form a glass frit film, followed by directly heating the glass frit film and making the same melted through a laser beam, so that the melted glass frit film forms a glass film that is respectively welded and connected to an upper substrate and a lower substrate, and that the upper substrate, the lower substrate and the glass film form a sealing structure with an organic light-emitting element sealed therebetween, so as to avoid the adverse effects caused by the external moisture, oxygen and the like.

FIG. 1 is a schematic view illustrating a packaging structure of an OLED device. As illustrated in FIG. 1, a photoelectric element 3 is interposed between a first substrate 1 and a second substrate 2; a passivation layer 4 is formed on the photoelectric element 3; and the first substrate 1 and the second substrate 2 are respectively air-tightly connected to a glass film 5 formed, for example, on the first substrate 1. The glass film 5 is formed by directly heating a glass frit film formed between the first substrate 1 and the second substrate 2 through a laser beam, and the glass film 5 surrounds the photoelectric element 3. By means of the sealing structure formed by the glass film 5 between the first substrate 1 and the second substrate 2, the external moisture, oxygen and the like are prevented from entering the interior of the OLED device and damaging the photoelectric element 3.

The inventor of this application noted that the glass film formed in a way of directly fabricating a glass frit film on a substrate by using a screen printing method or the like and heating the glass frit cannot be peeled off from the substrate, which limits the application of the glass film to some extent. In products obtained in a method that a frit is prepared on a substrate by using a screen printing method or the like and is melted and solidified to be connected to the two substrates by using a laser beam, although the width of the glass film can be controlled in a range of 600~800 μm by far, it is still too large for preparing narrow-bezel or borderless displays. Besides, upon an OLED device being packaged using a glass-film packaging method, the process of melting the glass frit film by using a laser beam is performed between the first substrate 1 and the second substrate 2 that are illustrated in FIG. 2, and because the glass film 5 is very close to the photoelectric element 3, the laser beam may damage the photoelectric element 3 to some extent.

At least one embodiment of the disclosure provides a preparation method of a glass film, a photoelectric device and a packaging method thereof, and a display device. The preparation of a glass film includes: forming a sacrificial layer on a base substrate; forming a glass frit film on the sacrificial layer; solidifying the glass frit film; and removing the sacrificial layer, so as to obtain a glass film. By preparing a glass frit film having a certain thickness, width and pattern on a sacrificial layer, then performing a solidifying process, and removing the sacrificial layer afterwards, an individual (independent) glass film can be obtained by the preparation method of glass film provided by embodiments of the disclosure. As compared with the method in which the obtained glass film cannot be separated from the substrate, the method of a glass film provided by embodiments of the disclosure can be used in more fields and is helpful to the narrow-bezel design.

By referring to the drawings, the following descriptions illustrate the preparation method of a glass film, the photoelectric device and the packaging method thereof, and the display device provided by embodiments of the disclosure.

Figure 2:
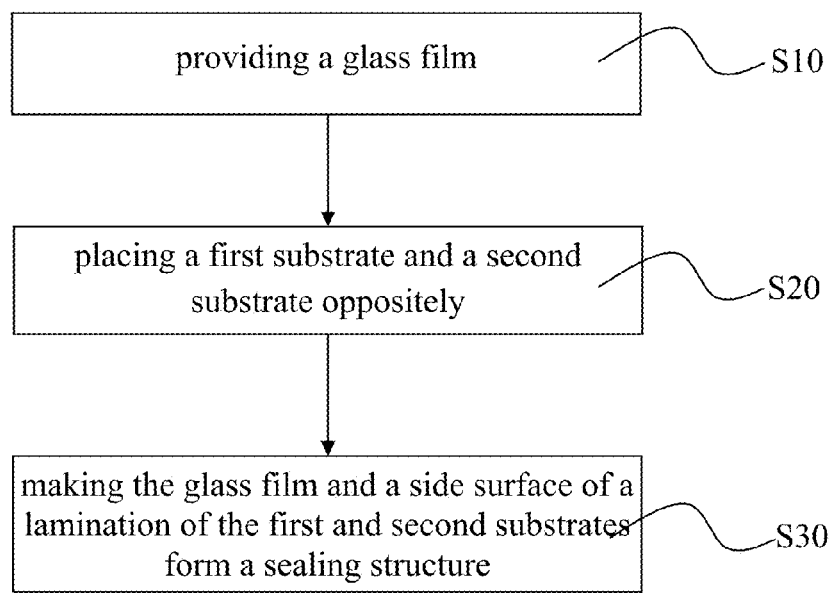
FIG. 2 is a flow chart illustrating a packaging method of a photoelectric device provided by an embodiment of the disclosure.

A packaging method of a photoelectric device provided by at least one embodiment of the disclosure, as illustrated in FIG. 2, includes the following steps S10 to S30, which are described sequentially below.

Step S10: providing a glass film.

Figure 3:
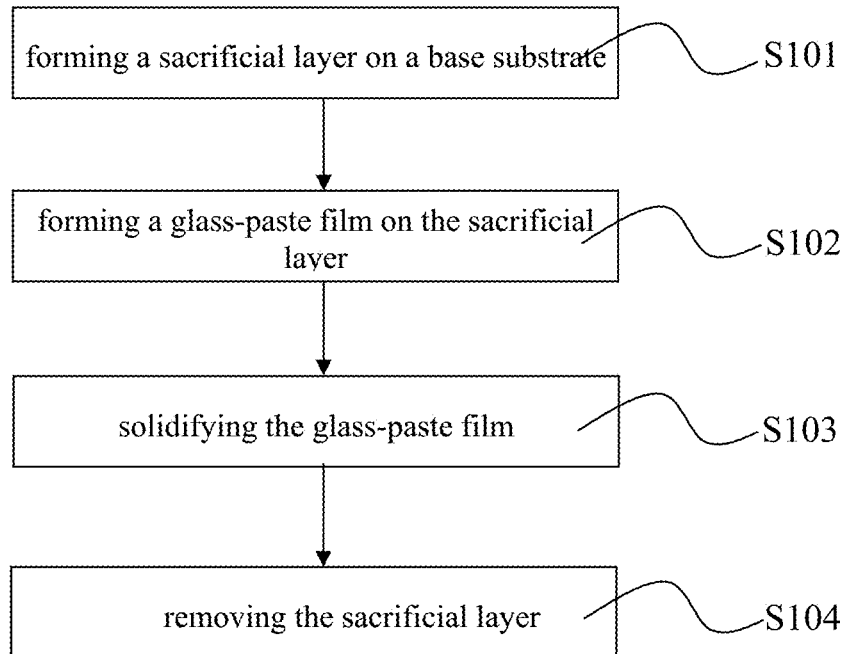
FIG. 3 is a flow chart illustrating a preparation method of a glass film provided by an embodiment of the disclosure.

For example, the glass film can be obtained through forming a layer of glass frit film on a sacrificial layer, then solidifying the glass frit film, and removing the sacrificial layer afterwards. Namely, providing the glass film, as illustrated in FIG. 3, can include the following steps S101 to S104.

Figure 4A:
FIG. 4*a* to FIG. 4*d* are schematic views illustrating respective steps of a preparation method of a glass film provided by an embodiment of the disclosure.

Step S101: forming a sacrificial layer on a base substrate. As illustrated in FIG. 4a, a sacrificial layer 52 is formed on a base substrate 51.

In an embodiment of the disclosure, the sacrificial layer 52 can be made of metal. For example, aluminum, magnesium, silver, copper or the like can be used. The base substrate 51 can be a glass substrate or a quartz substrate.

In embodiments of the disclosure, a layer of metal film can be prepared on a surface of the base substrate 51 through a magnetron sputtering method or a vacuum evaporating method to serve as the sacrificial layer 52. For example, the thickness of the metal film can be in a range of 10 nm to 1000 nm. Namely upon the sacrificial layer 52 being made of metal, the thickness of the sacrificial layer 52 can be in a range of 10 nm to 1000 nm according to the metal that is used, and this can guarantee that the glass frit film formed on the sacrificial layer 52 in the following process can be separated from the base substrate 51, and moreover, that the sacrificial layer 52 can also be removed easily.

Besides, before forming the sacrificial layer on the base substrate, the base substrate 51 can also be cleaned as required, and then the cleaned base substrate 51 is placed in an oven to be dried, so as to remove the moisture on the surface of the base substrate 51. The cleaning for the base substrate can make a thin film that is formed on the base substrate spread well, and thus make the formed thin film have a better flatness.

Figure 4B:
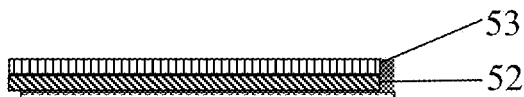

Step S102: forming a glass frit film on the sacrificial layer. As illustrated in FIG. 4b, a glass frit film 53 is formed on the sacrificial layer 52 obtained in step S102.

For example, a frit can be used to prepare the glass frit film 53. In at least one embodiment, a frit that is frequently-used by a person skilled in the art to prepare a glass film can be used. For example, the frit can be a composition including lead oxide, boron oxide and silicon oxide ($PbO$—$B_2O_3$—$SiO_2$), a composition including zinc oxide, boron oxide and silicon oxide ($ZnO$—$B_2O_3$—$SiO_2$), a composition including lead oxide, boron oxide, silicon oxide, aluminum oxide ($PbO$—$B_2O_3$—$SiO_2$—$Al_2O_3$), or a composition including lead oxide, zinc oxide, boron oxide and silicon oxide ($PbO$—$ZnO$—$B_2O_3$—$SiO_2$). Embodiments of the disclosure are not limited thereto.

In an embodiment of the disclosure, a frit can be dispersed in a dispersant and an adhesive to form a glass paste, and the glass paste is coated on the sacrificial layer to form the glass frit film by a screen printing method or a coating method, for example. By adjusting parameters of the screen printing method or the coating method, the glass frit film is made to have a preset thickness, width and pattern. In at least one embodiment, the thickness of the glass frit film can be greater than 0 μm and be smaller than or equal to 10 μm, and preferably, the thickness is from 1 μm to 10 μm, for example, 1 μm, 3 μm, 5 μm, 7 μm, 8 μm, 9 μm, and so on; and the smallest width of the glass film can reach to micron level. Certainly, the thickness of the glass frit film can also be greater than 10 μm. Both the dispersant and the adhesive can adopt an organic material known by a person skilled in the art, and embodiments of the disclosure are not limited thereto.

Step S103: solidifying the glass frit film.

For example, the glass frit film 53 obtained in step S102 is placed in an oven with nitrogen atmosphere therein to be heated, for example, the heating temperature is from 300° C. to 500° C.; and the organic materials (dispersant and adhesive) in the glass frit film 53 are removed in the heating process, so that the glass frit film 53 is solidified to form a glass film.

Step S104: removing the sacrificial layer.

Figure 4C:
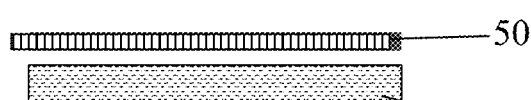
Figure 4D:

As illustrated in FIG. 4c, the sacrificial layer 52 is removed, so that the glass film formed from the glass frit film 53 can be separated from the base substrate 51 to form an individual (independent) glass film 50 illustrated in FIG. 4d after cleaning, drying processes and the like. For example, the thickness of the obtained glass film 50 can be greater than 0 μm and be smaller than or equal to 10 μm, and preferably the thickness is from 1 μm to 10 μm, for example, 1 μm, 3 μm, 5 μm, 7 μm, 8 μm, 9 μm, and so on; and the smallest width of the glass film can reach to micron level. The thickness, width and pattern of the glass film can be achieved through adjusting parameters of the screen printing method or the coating method in the above-mentioned process of preparing the glass frit film. Certainly, the thickness of the glass film can also be greater than 10 μm, and the embodiments of the disclosure are not limited thereto.

In embodiments of the disclosure, a chemical-corrosion method can be used to dissolve the sacrificial layer 52. For example, the base substrate 51 obtained in step S103 and formed with the glass film and the sacrificial layer 52 can be placed and immersed in a solution that can dissolve the sacrificial layer 52 for a certain period of time, and after the sacrificial layer 52 is completely dissolved, the glass film can be taken out of the solution and be cleaned and dried, and the glass film 50 is obtained.

Because the sacrificial layer can be made of metal, in an embodiment of the disclosure, the sacrificial layer can be removed by using an acid solution that can dissolve the metal. Namely, the sacrificial layer can be placed into an acid solution to be dissolved, so as to remove the sacrificial layer. For example, upon the sacrificial layer adopting magnesium, aluminum or the like, the acid solution can be hydrochloric acid; and for example, upon the sacrificial layer adopting silver, copper or the like, the acid solution can be nitric acid solution.

It is to be noted that, in embodiments of the disclosure, the glass frit film 53 is formed on the sacrificial layer 52, and when the glass frit film 53 is heated to be solidified in step S103, the sacrificial layer 52 is also heated, so the sacrificial layer 52 has to meet the requirement of bearing the temperature needed in the process of solidifying the glass frit film 53. Besides, in step S104, the base substrate 51 formed with the glass film and the sacrificial layer 52 is placed and immersed in a solution to remove the sacrificial layer 52, and during this process, it is required that the solution can remove the sacrificial layer 52, but cannot damage the glass film. Therefore, it is preferable that the sacrificial layer can stand the solidifying temperature of the glass frit film 53, can be removed to separate the glass film, and cannot damage the solidified glass frit film during the removing process. For example, the sacrificial layer in at least one embodiment of the disclosure is made of metal. But embodiments of the disclosure are not limited thereto, and any other material that satisfies the above-mentioned requirements can also be used to prepare the sacrificial layer in embodiments of the disclosure.

Next, the step S20 and step S30 of the method provided by the embodiment illustrated in FIG. 2.

Step S20: placing a first substrate and a second substrate oppositely with a photoelectric element interposed therebetween.

Figure 5:
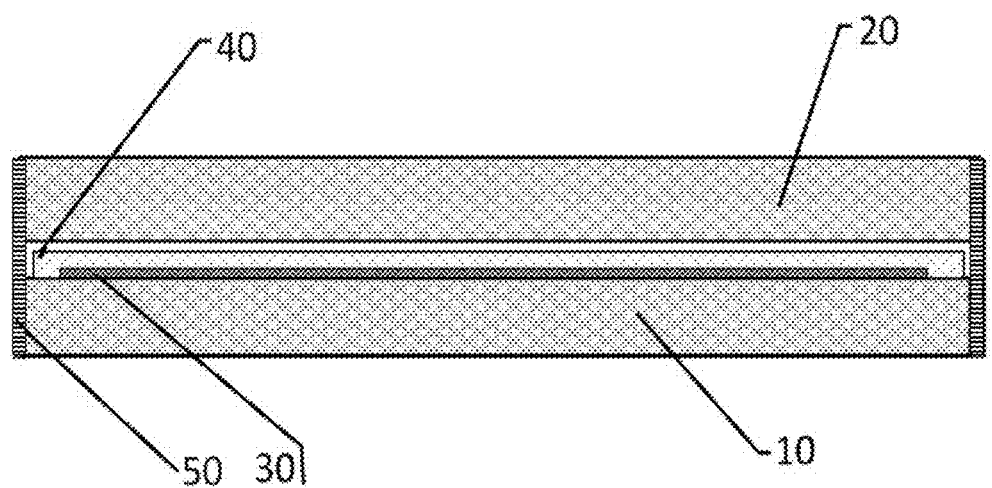
FIG. 5 is a schematic view illustrating a packaging structure of a photoelectric device packaged by means of a glass film and provided by an embodiment of the disclosure.

For example, as illustrated in FIG. 5, a photoelectric element 30 and other functional layers or structural layers can be formed on a first substrate 10; a second substrate 20 can be a cover glass with a drying agent attached on an internal side thereof; and then the side of the first substrate 10 with a photoelectric element 30 formed thereon and the side of the second substrate 20 with the drying agent attached thereon are placed oppositely, so that the first substrate 10 and the second substrate 20 are attached together.

As illustrated in FIG. 5, a passivation layer 40 can be further placed on the photoelectric element 30 so as to protect the photoelectric element 30. For example, the passivation layer 40 can be a composite film of a silicon nitride film and a silicon oxide film that are sequentially formed by using a plasma enhanced chemical vapor deposition (PECVD) or other method.

Step S30: making the glass film and a side surface of a lamination of the first substrate and the second substrate form a sealing structure, so that the photoelectric element is sealed between the first substrate and the second substrate.

For example, as illustrated in FIG. 5, the first substrate 10 and the second substrate 20 are laminated, and the glass film 50 is attached to a side surface of the lamination of the first substrate 10 and the second substrate 20, and in this case, the glass film 50 has a flat strip shape, for example, a surface of the glass film is attached to side surfaces of the first substrate 10 and the second substrate 20 with the thickness direction of the glass film being perpendicular to the side surfaces of the first substrate 10 and the second substrate 20. The length direction the glass film is the same as that of the side surfaces of the first substrate 10 and the second substrate 20. The glass film 50 is irradiated by using the laser, so that the glass film 50 is welded and connected to the side surfaces of the first substrate 10 and the second substrate 20 respectively. Certainly, other external forces (for example, magnetic force or mechanical pressure of a heave object) can also be used to make the glass film 50 be connected to corresponding side surfaces of the first substrate 10 and the second substrate 20 respectively to form a sealing structure. Embodiments of the disclosure are not limited thereto.

Besides, before forming the sealing structure, the packaging method of a photoelectric device provided by embodiments of the disclosure can further adopt the packaging way illustrated in FIG. 1. Namely, in at least one embodiment, the glass film obtained in step S10 can further be interposed between the first substrate and the second substrate, so that the glass film surrounds the photoelectric element and that the glass film is welded and connected to a surface of the first substrate and a surface of the second substrate that are opposite to each other. This sealing structure and the glass film placed on side surfaces of the first substrate and the second substrate in the following process can form a double sealing structure, which can realize a better packaging effect.

In the photoelectric device illustrated in FIG. 1 and formed by melting a glass frit film between two substrates with a laser beam and making the glass frit film be connected to the two substrates, the width of the glass film is from 600 μm to 800 μm. By contrast, in embodiments of the disclosure, an individual (independent) glass film can be used to package a photoelectric device, the thickness of the glass film can be greater than 0 µm and be smaller than or equal to 10 µm, and the smallest width of the glass film can reach to micron level, so the glass film in the embodiments of the disclosure occupies a smaller space and contributes to the narrow-bezel design of the photoelectric device. In the photoelectric device provided by embodiments of the disclosure, the individual glass film can be placed on a side surface of a lamination of two substrates, but in the photoelectric device illustrated in FIG. 1, the glass film formed by directly melting a glass frit film with a laser beam cannot be placed on a side surface of a lamination of two substrates; and as compared with the method of interposing a glass film between two substrates horizontally, the method of placing a glass film on a side surface of a lamination of two substrates can realize that a side surface of the glass film and along the width or thickness direction is connected to corresponding side surfaces of two substrates of the photoelectric device, and this can further be helpful to the narrow-bezel design of the photoelectric device. Besides, in embodiments of the disclosure, the glass film is placed on a side surface of a lamination of two substrates, as compared with the method of interposing a glass film between two substrates, the glass film is further away from the photoelectric element, so when the glass film is irradiated by laser, the laser has less damage to the photoelectric element.

At least one embodiment of the disclosure further provides a photoelectric device, as illustrated in FIG. 5, the photoelectric device includes a first substrate 10 and a second substrate 20 that are placed oppositely, a photoelectric element 30 interposed between the first substrate 10 and the second substrate 20, and a glass film 50. The glass film 50 is placed on a side surface of a lamination of the first substrate 10 and the second substrate 20, and forms a sealing structure together with the first substrate 10 and the second substrate 20.

For example, the photoelectric element can be an OLED, a solar cell or other photoelectric system.

In an embodiment of the disclosure, another glass film can be further interposed between the first substrate 10 and the second substrate 20 and surround the photoelectric element, and the glass film is connected to a surface of the first substrate 10 and a surface of the second substrate 20 that are opposite to each other, so as to form another sealing structure. Combined with the glass film placed on side surfaces of the first substrate and the second substrate, this can form a double sealing structure to achieve a better packaging effect.

Implementations of the photoelectric device provided by embodiments of the disclosure can be referred to the embodiments of the above-mentioned packaging method of a photoelectric device, and the detailed description thereof is omitted herein.

At least one embodiment of the disclosure further provides a display device, which includes any of the above-mentioned photoelectric devices. For example, the photoelectric element is an OLED element. The display device may be an OLED panel, a cell phone, a tablet computer, a television, a display, a notebook computer, a digital photo frame, a navigator or any other product or component having a display function.

Implementations of the display device provided by embodiments of the disclosure can be referred to the embodiments of the above-mentioned photoelectric device, and the detailed description thereof is omitted herein.

At least one embodiment of the disclosure further provides a preparation method of a glass film, and the method includes: forming a sacrificial layer on a base substrate; forming a glass frit film on the sacrificial layer; solidifying the glass frit film; and removing the sacrificial layer, so as to obtain a glass film.

In an embodiment of the disclosure, the sacrificial layer is made of metal, and for example, the sacrificial layer is prepared by a sputtering method, a vacuum evaporating method or the like. In an embodiment of the disclosure, the sacrificial layer is placed into an acid solution to be dissolved, so that the sacrificial layer is removed.

Implementations of the preparation method of a glass film provided by embodiments of the disclosure can be referred to the embodiments of the above-mentioned packaging method of a photoelectric device, and the detailed description thereof is omitted herein.

In embodiments of the disclosure, a glass paste obtained by mixing a frit with a dispersant and an adhesive can be coated on a base substrate formed with a sacrificial layer through a screen printing method or a coating method, so as to obtain a glass frit film; and through adjusting parameters of the screen printing or coating methods, a glass film formed by solidifying the glass frit film and removing the sacrificial layer can have a thickness of greater than 0 µm and of smaller than or equal to 10 µm, have a smallest width down to micron level, and be formed with a preset pattern. As compared with a glass film formed on a substrate by directly irradiating a glass frit film with a laser beam, the glass film provided by embodiments of the disclosure is an independent glass film, the optional ranges of the thickness and the width are wider, and the design for the pattern can be more flexible, so the glass film can be used in more fields. For example, the glass film can be placed on corresponding side surfaces of two substrates of a photoelectric device, and especially, the side surface of the glass film and along the width or thickness direction can be connected to corresponding side surfaces of two substrates of a photoelectric device.

To sum up, by dissolving a sacrificial layer through a chemical-corrosion method to peel off the glass frit film prepared on the sacrificial layer, an individual glass film can be formed, the thickness of which can be greater than 0 µm and be smaller than or equal to 10 µm, the width and the pattern of which can be designed through adjusting parameters of a screen printing method or a coating method. Upon the glass film being applied to the packaging of a photoelectric device, a better packaging effect can be realized. As compared with the method of forming a glass film between two substrates directly, embodiments of the disclosure have the following advantages that:

1. the glass film provided by embodiments of the disclosure can be exist as an independent glass film, so its thickness and width have wider optional ranges, the design of its pattern can be more flexible, and the glass film can be used in more fields;

2. upon the glass film provided by embodiments of the disclosure being applied in a photoelectric device, because of a smaller space the glass film occupies, the glass film is helpful to the narrow-bezel design;

3. in embodiments of the disclosure, a side surface of the glass film and along the width or thickness direction can be connected to corresponding side surfaces of two substrates of a photoelectric device, and this is further helpful to the narrow-bezel design; and the glass film is placed on the side surfaces of two substrates of the photoelectric device, the glass film is further away from the photoelectric element, so upon the glass film being irradiated by laser to be connected to the substrates, the laser has less damage to the photoelectric element.

What are described above is related to the illustrative embodiments of the disclosure only and not limitative to the scope of the disclosure; the scopes of the disclosure are defined by the accompanying claims.

The invention claimed is:

1. A packaging method of a photoelectric device, comprising
providing a glass film;
placing a first substrate and a second substrate oppositely with a photoelectric element interposed therebetween; and
making the glass film and a side surface of a laminate of the first substrate and the second substrate form a sealing structure, so that the photoelectric element is sealed between the first substrate and the second substrate,
wherein, providing the glass film comprises:
forming a sacrificial layer on a base substrate;
forming a glass frit film on the sacrificial layer;
solidifying the glass frit film; and
removing the sacrificial layer, so as to obtain the glass film.

2. The packaging method as claimed in claim 1, wherein the sacrificial layer is placed into an acid solution to be dissolved, so that the sacrificial layer is removed.

3. The packaging method as claimed in claim 2, wherein the sacrificial layer is made of metal.

4. The packaging method as claimed in claim 1, wherein a thickness of the glass film is greater than 0 μm and is smaller than or equal to 10 μm.

5. The packaging method as claimed in claim 1, wherein a frit is dispersed in a dispersant and an adhesive to form a glass paste, and the glass paste is coated on the sacrificial layer to form the glass frit film.

6. The packaging method as claimed in claim 5, wherein the frit comprises:
a composition comprising lead oxide, boron oxide and silicon oxide,
a composition comprising zinc oxide, boron oxide and silicon oxide,
a composition comprising lead oxide, boron oxide, silicon oxide, aluminum oxide, or
a composition comprising lead oxide, zinc oxide, boron oxide and silicon oxide.

7. The packaging method as claimed in claim 3, wherein the metal for fabricating the sacrificial layer comprises aluminum, magnesium, silver or copper.

8. The packaging method as claimed in claim 3, wherein a thickness of the sacrificial layer is from 10 nm to 1000 nm.

9. The packaging method as claimed in claim 2, wherein forming the sealing structure comprises:
attaching the glass film to side surfaces of the first substrate and the second substrate; and
irradiating the glass film by using a laser beam, so that the glass film is welded and connected to the side surfaces of the first substrate and the second substrate, respectively.

10. The packaging method as claimed in claim 1, further comprising:
interposing the glass film between the first substrate and the second substrate, so that the glass film surrounds the photoelectric element and the glass film is respectively welded and connected to a surface of the first substrate and a surface of the second substrate that are opposite to each other.

11. A preparation method of a glass film, comprising:
forming a sacrificial layer on a base substrate;
forming a glass frit film on the sacrificial layer;
solidifying the glass frit film; and
removing the sacrificial layer, so as to obtain a glass film.

12. The preparation method as claimed in claim 11, wherein the sacrificial layer is placed into an acid solution to be dissolved, so that the sacrificial layer is removed.

13. The preparation method as claimed in claim 11, wherein the sacrificial layer is made of metal.

* * * * *